SINGLE WHEEL COUNTER CIRCUIT

Filed Jan. 17, 1966 Sheet 1 of 2

INVENTOR.
JOSEPH A. RICHARDS
BY
Lindsey, Prutzman and Hayes
ATTORNEYS

SINGLE WHEEL COUNTER CIRCUIT

Filed Jan. 17, 1966 Sheet 2 of 2

INVENTOR.
JOSEPH A. RICHARDS
BY
Lindsey, Prutzman and Hayes
ATTORNEYS

United States Patent Office 3,445,636

Patented May 20, 1969

3,445,636

SINGLE WHEEL COUNTER CIRCUIT

Joseph A. Richards, Manchester, Conn., assignor to Veeder Industries Inc., a corporation of Connecticut Filed Jan. 17, 1966, Ser. No. 535,262
Int. Cl. G06f 7/385
U.S. Cl. 235—92 5 Claims

ABSTRACT OF THE DISCLOSURE

A single wheel counter having an electromagnetically driven wheel wherein the wheel drive mechanism also rotates a 4-armed contact that cooperates with conductive portions of a printed circuit board to provide a plurality of electrical output signals including an electrical signal to signify wheel position, an electrical signal upon change of position of the contact means and electrical signals for counter reset and transfer. By modification of the circuit board the same counter mechanism is used to provide binary coded decimal readout.

This invention relates generally to single wheel electromagnetic counters with electrical readout and, more particularly, to such counters having improved printed circuit boards for providing a variety of electrical functions including combined acknowledgment and decimal electrical readout and an improved binary coded decimal electrical readout.

The general object of the invention is to provide a single wheel counter with a plurality of interchangeable printed circuit boards which permit various forms of electrical readout corresponding to the position of the counter.

A specific object of the invention is to provide a single wheel counter with an improved printed circuit board which furnishes both an electrical decimal count readout and an electrical acknowledgment signal indicative of a change in counting position.

Still another object of the invention is to provide such a printed circuit board affording a combined decimal and acknowledgment readout in combination with an improved printed circuit on the same board for furnishing electrical reset and transfer signals.

Another specific object of the invention is to provide a single wheel counter with an improved circuit board which affords an improved binary coded decimal electrical readout.

Another object of the invention is to provide such a circuit board affording an improved binary coded decimal electrical readout and also producing reset and transfer signals.

Other objects will be in part obvious and in part pointed out more in detail hereinafter.

The invention accordingly consists in the features of construction, combination of elements and arrangement of parts which will be exemplified in the construction hereafter set forth and the scope of the application will be indicated in the appended claims.

Figure 1:
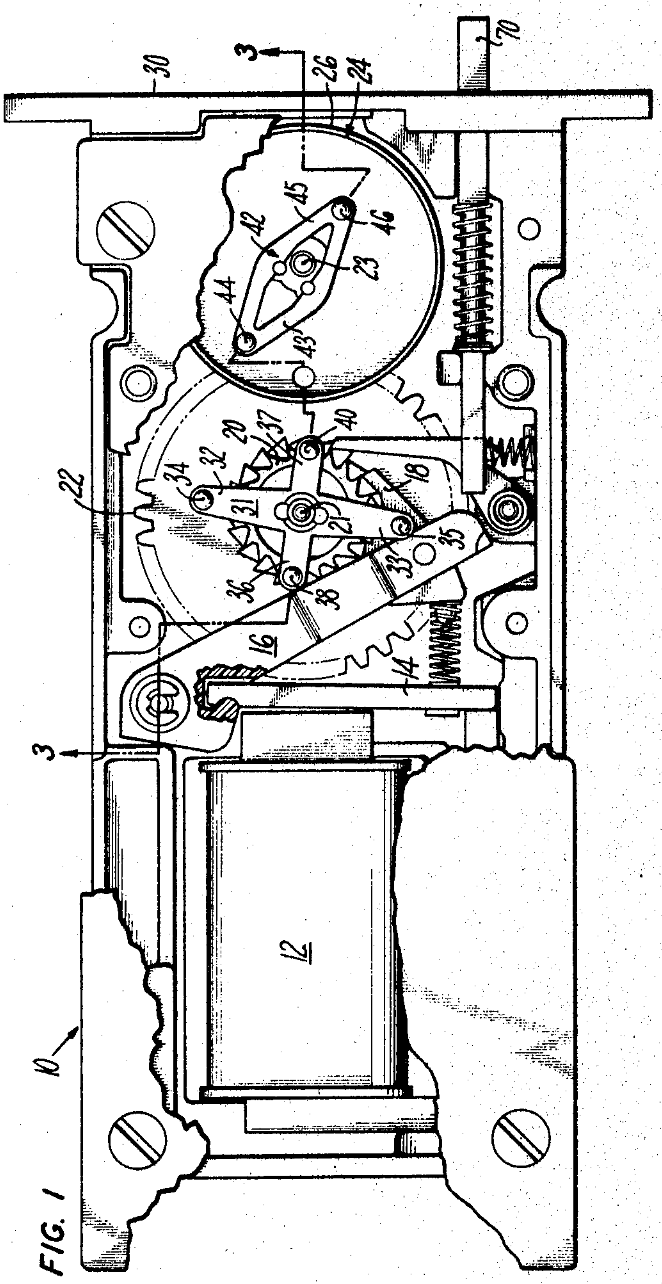
FIGURE 1 is a partially cut away side view of an electromagnetic single wheel counter module embodying the principles of the invention.
Figure 3:
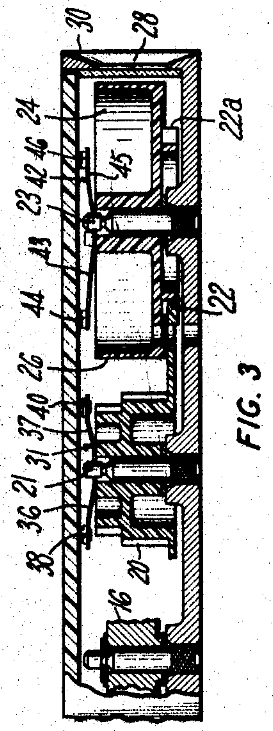
FIGURE 3 is a cross-sectional view taken along lines 3—3 of FIGURE 1.
Figure 5:
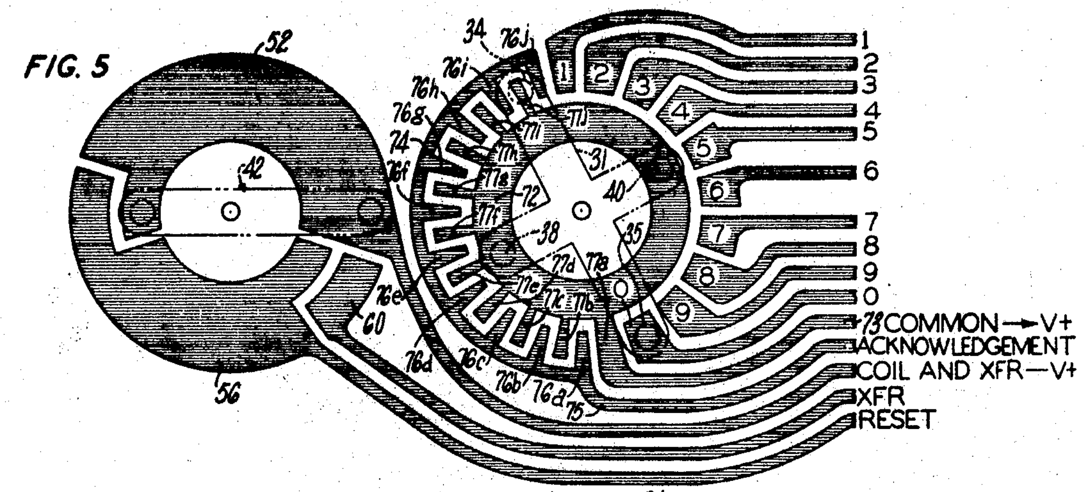
Figure 6:
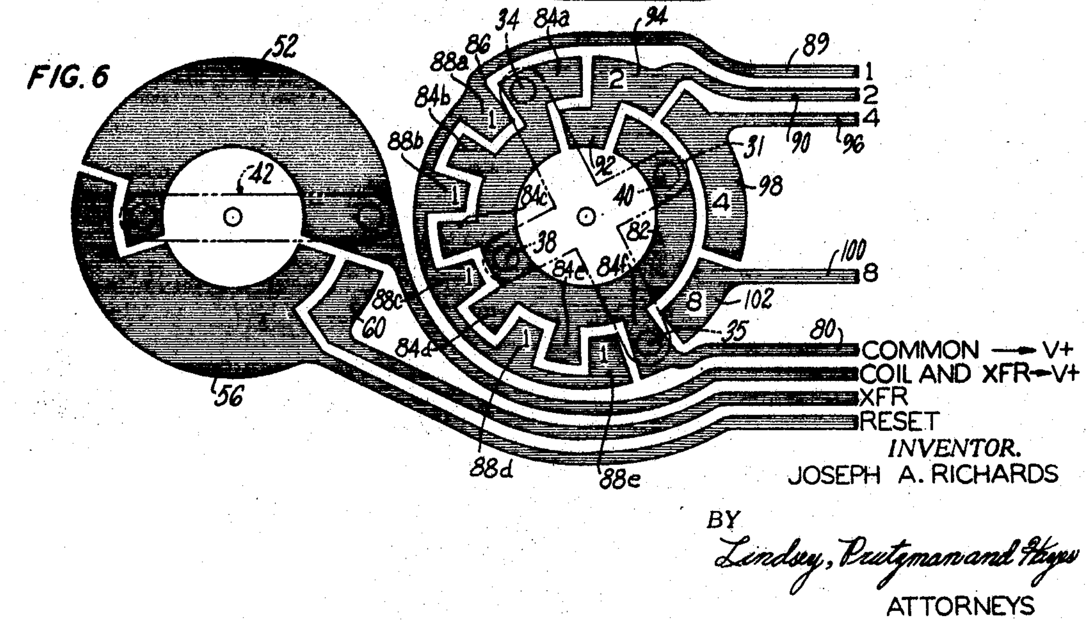

FIGURE 5 shows the electrical conductor configuration on a printed circuit board for providing a combined electrical decimal readout and acknowledgment together with reset and transfer functions when incorporated in the single wheel electromagnetic counter illustrated in FIGURE 1; and FIGURE 6 shows an electrical circuit configuration of a printed circuit board for providing an improved binary coded decimal electrical readout in combination with reset and transfer functions for the electromagnetic counter illustrated in FIGURE 1.

Figure 2:
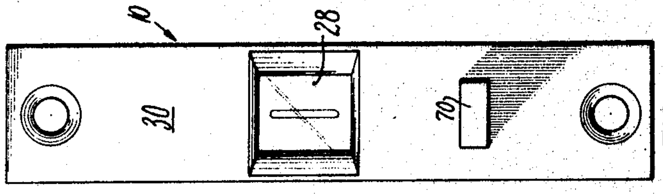
FIGURE 2 is a front view of the counter module illustrated in FIGURE 1.

In FIGURE 1 there is illustrated a single wheel electromagnetic decade counter module 10. The basic components of such a counter are a solenoid 12, its armature 14, a lever arm 16 actuated by the armature, a pawl 18 coupled to the lever arm, and a ratchet 20 stepped by the pawl. Each time solenoid 12 is energized, the pawl causes ratchet 20 to rotate one ratchet step about a shaft 21. Fixed to shaft 21 to rotate with ratchet 20 is a gear 22 which engages another gear 22*a* fixed to a shaft 23 driving a number wheel 24 which carries the ten decimal numerals printed around its face 26. These numbers are displayed through a window 28 formed in the front panel 30 of counter module 10 as illustrated in FIGURE 2.

Fixed to ratchet shaft 21 and rotating with ratchet 20 and gear 22 is a four-arm brush assembly 31 made of conductive material. Assembly 31 has two long brush arms 32 and 33 carrying contacts 34 and 35 respectively, and two short brush arms 36 and 37 carrying contacts 38 and 40, respectively. These contacts are arranged to engage the printed conductors on the circuit boards illustrated in FIGURES 4, 5 and 6.

In like manner, a two-arm brush assembly 42 is eccentrically fixed to shaft 23 to rotate with number wheel 24. Brush assembly 42 is also made of conductive material. The longer arm 43 of assembly 42 carries a contact 44 and the shorter arm 45 carries a contact 46. Contacts 44 and 46 are also arranged to engage the printed circuit boards illustrated in FIGURES 4, 5 and 6. Because of the gearing arrangement, ratchet 20 and its associated brush assembly 31 rotate in the opposite direction from number wheel 24 and its associated brush assembly 42. Furthermore, brush 42 and number wheel 24 turn through two revolutions for every one revolution of brush 31 and ratchet 20.

Figure 4:
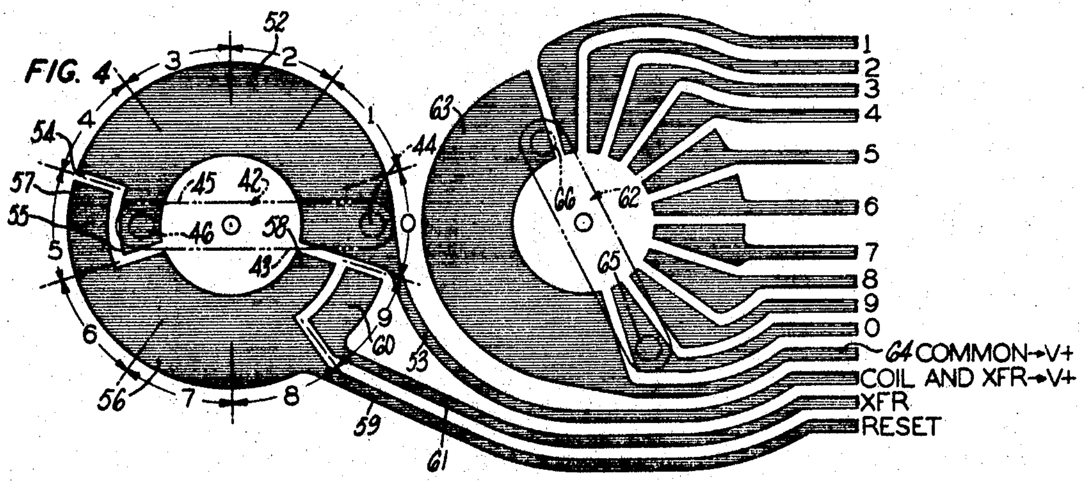
FIGURE 4 illustrates the configuration of the printed electrical conductors on a circuit board for providing simultaneous decimal electrical readout and reset and transfer functions when incorporated in the single wheel counter of FIGURE 1.

FIGURES 4, 5 and 6 show various printed circuit board arrangements which may be interchangeably used with the single wheel counter module 10 illustrated in FIGURE 1.

In each of the FIGURES 4, 5 and 6 the transfer and reset printed circuit configurations are identical. In FIG- URE 4, there is shown a printed circuit which would appear on a circuit board for use in the counter module 10 to provide reset and transfer signals in combination with electrical decimal readout. The conductive brush assembly 42 rotates counterclockwise so that, starting from the position illustrated, contact 44 wipes around the outer portion of the printed conductive segment 52 which is integral with a printed lead 53 which extends to the right edge of the board and is labeled "COIL and XFR." This lead is to be connected to a suitable source of electrical power V+. The outer portion of segment 52 wiped by contact 44 terminates at point 54, but continues for approximately another 36° as an extension 55 on the inner portion wiped by contact 46. After leaving segment 52, contact 44 passes to a printed conductor segment 56 having an outer extension 57 wiped only by contact 44 and an inner extension 58 wiped only by contact 46. Segment 56 is connected to the right edge of the circuit board by an integral lead 59 which is labeled "RESET." An approximately 36° printed segment 60 is disposed between segments 52 and 56 only in the path of contact 44 and is connected to the edge of the circuit board by an integral lead 61 labeled "XFR."

The electrical readout provided by the circuit board of FIGURE 4 is decimal and contains ten printed conductive segments and integral leads extending to the right hand side of the circuit board and labeled as "1," "2" . . . "0." Only a two-armed brush 62, illustrated in dashed lines, is required in FIGURE 4 since no acknowledgement function is provided. Brush 62 rotates with ratchet 20, and because of the 2:1 gearing, rotates only 18° for each counter step rather than the 36° moved by brush 42 for each step. Such an arrangement permits the ten decimal printed segments "1," "2" . . . "0" to be arranged in an approximately 180° arc. The rest of the circle is completed by an approximately 180° segment 63 which is connected to the edge of the board via an integral printed lead 64 marked "COMMON." A suitable power source V+ is to be connected to lead 64. Brush 62 is mounted eccentrically so that each of the contacts 65 and 66 wipes a different path along the printed segments "1," "2" . . . "0" and 63, thereby reducing wear of the segments.

Therefore, each time the solenoid 12 is activated, brush 42 moves 36° in a counterclockwise direction and brush 62 moves 18° in a clockwise direction. Starting from the initial position illustrated, during the first counter step, contact 66 moves from the common or power segment 63 to the "1" output segment, and contact 65 moves from the "0" segment to segment 63. Consequently, an electrical signal will appear between the "1" output lead and the common output lead 64, indicating that the counter number wheel 24 is positioned so that the numeral "1" is seen through window 28 in the counter module 10. This signal may be fed to a suitable indicator or control circuit. At the end of ten steps brush 62 has moved through approximately 180°, and the positions of contacts 65 and 66 are reversed from those illustrated for the starting position.

In the meantime, the brush 42 has moved in ten steps through 360°. Brush 42 is also illustrated in dashed lines in its starting or "0" position. Power V+ is applied to the "COIL and XFR" lead 53. During the first step, contact 44 remains on the "COIL and XFR" segment 52, but contact 46 moves to the "RESET" segment 56. Because of the eccentric mounting of brush 42 and the configuration of the segment extensions 55, 57 and 58, brush 42 bridges segments 52 and 56 for all count positions except the initial or "0" position and position "9." In position "9" contact 44 rests on transfer segment 60. At this position a "TRANSFER" signal appears on lead 61. This signal may be used to activate another decade counter module when brush 42 moves from position "9" to "0" on the next counter step.

In positions "1" through "8" of contact 44, brush 42 bridges segments 52 and 56 to supply an electrical signal on the "RESET" lead 59. In these "RESET" positions, the counter module may be returnd to zero by pushing the reset switch arm 70 of counter module 10. A switch (not shown) in the counter module will activate a circuit to step the number wheel 24 and the brushes 42 and 62 to their "0" or initial positions.

FIGURE 5 illustrates a printed circuit board for use with the counter module 10 for providing an acknowledgment signal in combination with the decimal readout and the same reset and transfer functions performed by the circuit illustrated in FIGURE 4.

The brush illustrated in broken lines in FIGURE 5 on the right hand portion of the board is identical to brush 31 illustrated in FIGURE 1 and is indicated by the reference numeral 31. When the number wheel 24 rotates, brush 31 rotates clockwise therewith with contacts 40 and 38 wiping continuously on the circular common or power segment 72. Power is applied to segment 72 via an integral printed conductor lead 73 which extends to the right hand edge of the board and is labeled, "COMMON V+." Furthermore, there are ten printed segments arranged in substantially 180° arc and corresponding to the ten decimal numbers "1," "2" . . . "0." Each segment includes an integral printed lead which extends to the right side of the circuit board.

However, in FIGURE 5 there is an additional printed conductor segment 74 formed in an arc substantially opposite the ten decimal segments. Segment 74 is referred to as the acknowledgment segment and is connected via an integral lead 75 to the right hand side of the circuit board and labeled, "ACKNOWLEDGMENT." Segment 74 has ten inwardly extending integral projections *76a*, *76b* . . . *76j* which interleave with ten corresponding outwardly extending integral projections *77a*, *77b* . . . *77j* of the common or power segment 72.

In operation, as brush 31 rotates clockwise from the zero position illustrated in dashed lines, contact 34 wipes successively across the ten decimal segments "1," "2" . . . "0," stepping along the segments in accordance with the discrete activations of solenoid 12 in counter module 10. As contact 34 moves to segment "1," contact 35 moves across projection *77a* of the common or power segment 72 and momentarily bridges both *77a* and projection *76a* of the acknowledgement segment 74, thereby applying power to the acknowledgment output lead 75. However, at the end of this first step contact 34 rests on decimal segment "1," and contact 35 rests on the center of projection *77b* of segment 72 between the acknowledgment projections *76a* and *76b* so that no signal appears on acknowledgment lead 75 in the rest position of brush 31.

As contact 34 moves from one decimal segment to another, contact 35 momentarily bridges the corresponding acknowledgment and common segment projections to provide an electrical signal on lead 75 that the counter wheel has been moved one position. This signal is only transitory since it is produced only when brush 31 is in transit between two positions. After 180°, contact 35 wipes the decimal segments and contact 34 wipes the common and acknowledgment projections.

The transfer and reset functions provided by brush 42 wiping printed segments 52, 56 and 60 are accomplished as already described in connection with FIGURE 5.

In FIGURE 6 there is shown a binary coded decimal circuit board for use in the counter module 10 of FIGURE 1. Here power is applied to the printed conductor "COMMON" lead 80 which is connected to an inner split printed conductor segment 82 having six outwardly extending projections *84a*, *84b* . . . *84f*. Furthermore, a printed conductor segment 86 corresponding to the binary coded decimal output "1" includes five inwardly extending integral projections *88a*, *88b* . . . *88e* which interleave with the "COMMON" segment projections *84a*, *84b* . . . *84f*. A printed lead 89 connects the "1" output to the right edge of the circuit board.

A printed conductor output lead 90 corresponding to the binary coded decimal output "2" is connected to a conductive segment having one portion 92 aligned with but insulated from "COMMON" segment 82 so that it is wiped by contacts 40 and 38 and another portion 94 aligned with "COMMON" segment portion 84*a* and wiped by contacts 34 and 35.

A printed conductor lead 96 connects the "4" output to a printed "4" segment 98 aligned with "2" segment portion 94 so that it is wiped by contacts 34 and 35.

A printed conductor lead 100 connects the binary coded decimal "8" output to a printed conductor "8" segment 102 which is aligned with the "1" projections 88, the "4" segment 98, and the "2" segment portion 94 to be wiped by contacts 34 and 35.

Brush 31 is driven through an 18° arc for each counter step. Conductive segment projections 88*a* . . . 88*e*, and 84*a* . . . 84*f* and segment portion 92 are all approximately 18° wide. Segment portion 94 and segment 102 are approximately 36° wide, and segment 98 is approximately 72° wide. The transfer and reset circuit is identical to those illustrated in FIGURES 5 and 6.

In the initial or "0" position of brush 31 illustrated in dashed lines in FIGURE 6, all four contacts 34, 35, 40 and 38 are on the COMMON conductor segment 82, and there is no output on any of the output leads. However, for the first input pulse to solenoid 12 of counter module 10, brush 31 rotates 18° clockwise so that contact 35 moves to the "1" projection 88*e* while contact 34 moves to another position on COMMON segment projection 84*a*. Consequently, power is applied from COMMON lead 80 through COMMON segment 82 and brush 31 to projection 88*e* on "1" segment 86, thereby providing an electrical signal on "1" output lead 89. No signal appears on any of the other output leads. For the next input to solenoid 12, brush 31 is stepped so that contact 35 moves to COMMON segment projection 84*e* and contact 34 moves to the "2" segment portion 94 to provide an output signal only on the "2" output lead 90. The next counter input will cause contact 35 to move to "1" projection 88*d* and contact 34 to move to a different position on "2" segment portion 94. Consequently, power will be applied through COMMON segment 82, contacts 40 and 38, and brush 31 only to "1" output lead 89 and "2" output lead 90, thereby indicating a readout of "3" corresponding to the position of number wheel 24 when the number "3" is visible through window 28.

The following table shows the positions of brush 31 relative to the binary coded decimal readout obtained from the "1," "2," "4" and "8" output leads. Column 1 shows the count or step number of number wheel 24 of counter module 10; column 2 shows the contacts through which power is applied from COMMON segment 82; column 3 shows the contacts on brush 31 which apply power to the binary coded decimal output leads; and in column 4, *x* indicates the output leads carrying signals to provide the binary coded decimal electrical readout for each count position.

| 1 | 2 | 3 | 4 | | | |
|---|---|---|---|---|---|---|
| | | | BCD output leads | | | |
| Count | Power contacts | Readout contacts | 1 | 2 | 4 | 8 |
| 0 | 40 and 38 | 34 and 35 | | | | |
| 1 | 40 and 38 | 35 | x | | | |
| 2 | 40 and 38 | 34 | | x | | |
| 3 | 40 and 38 | 34 and 35 | x | x | | |
| 4 | 40 and 38 | 34 | | | x | |
| 5 | 40 and 38 | 34 and 35 | x | | x | |
| 6 | 40 | 34 and 38 | | x | x | |
| 7 | 40 | 34, 35 and 38 | x | x | x | |
| 8 | 40 and 38 | 34 | | | | x |
| 9 | 40 and 38 | 34 and 35 | x | | | x |
| 0 | 40 and 38 | 34 and 35 | | | | |

The most important feature of the invention described above is the embodiment illustrated in FIGURE 5. This embodiment shows a printed circuit board for use in counter module 10 for simultaneously providing both decimal electrical readout and electrical ACKNOWLEDGMENT signals for indicating a change in the position of the number wheel of the counter module. FIGURE 6 illustrates a unique arrangement of printed circuit conductors on a circuit board for use in a counter module for providing a binary coded decimal electrical readout. FIGURE 4 and also FIGURES 5 and 6 show a printed circuit board including printed conductor segments for providing RESET and TRANSFER signals in combination with electrical readout of the counter position. The reset and transfer segments are arranged on the circuit board to be wiped by a conductive brush driven by the number wheel, while the readout segments are arranged to be wiped by a conductive brush driven by the ratchet of the counter module. The shaded areas in FIGURES 4 through 6 represent printed electrical conductors while the unshaded areas represent the areas of a non-conducting circuit board which electrically isolate various conductors from one another.

As will be apparent to persons skilled in the art, various modifications and adaptations of the structure above described will become readily apparent without departure from the spirit and scope of the invention, the scope of which is defined in the appended claims.

I claim:

1. A single wheel electromagnetic counter with electrical readout comprising in combination:

(a) means for driving said wheel,
(b) first contact means driven by said driving means,
(c) a circuit board mounted adjacent said driving means,
(d) a first plurality of conductors on said board arranged to be successively engaged by said contact means to provide electrical readout of the position of said wheel,
(e) a second plurality of conductors on said board arranged relative to said contact means and to said first plurality of conductors to provide electrical readout of each change of position of said contact means relative to said first plurality of conductors, and
(f) conductor means on said circuit board for applying electrical power to one of said first and second plurality of conductors.

2. The combination defined in claim 1 wherein said conductor means comprises a plurality of electrically connected spaced conductor elements, said conductor elements being interleaved with said second plurality of elements, and being arranged to be engaged by said first contact means.

3. The combination defined in claim 1 further comprising:

(a) a second contact means driven by said driving means, and
(b) a third plurality of conductors on said board for providing counter reset and transfer functions and arranged to be engaged by said second contact means.

4. A single wheel electromagnetic counter with binary coded decimal readout comprising in combination:

(a) means for driving said wheel,
(b) contact means driven by said driving means,
(c) four spaced arms on said contact means, one pair of arms moving in a path different from the other pair,
(d) a circuit board mounted adjacent said driving means,
(e) a plurality of conductors on said board arranged to be engaged by said arms, said conductors being disposed in a first group in the path of the shorter arms and in a second group in the path of the longer arms, some of said conductors having different dimensions along their respective paths, and
(f) means for applying electrical power to one of said conductors, said two groups of conductors being so disposed and dimensioned as to provide an electrical binary coded decimal readout of the counter wheel position when said contact means is driven by said driving means.

5. A circuit on a circuit board for use with an electromagnetic counter having a four-arm brush driven by the counter to provide electrical readout and acknowledgment comprising:

(a) a first set of conductors on the board arranged along a portion of an outer circular path, (b) a second set of electrically connected spaced conductors arranged along a different portion of said outer circular path, (c) a conductive ring concentric with and inside of said circular path, said ring having a plurality of outwardly extending spaced integral projections disposed in said outer circular path, said projections and said second set of conductors being interleaved, said ring being located to be engaged by two arms of said brush, said first and second set of conductors and said projections being located to be engaged by the other two arms of said brush, and (d) means for applying electrical power to said ring, whereby both electrical readout of the position of said counter and an electrical signal indicative of a change of position of said counter are provided on said first and second set of conductors, respectively, when said brush is driven by said counter.

References Cited

UNITED STATES PATENTS

| | | | |
|---|---|---|---|
| 2,984,413 | 5/1961 | Renshaw | 235—92 |
| 3,238,359 | 3/1966 | Einem | 235—92 |
| 3,341,694 | 9/1967 | Heimberger | 235—92 |

MAYNARD R. WILBUR, *Primary Examiner.*

GREGORY J. MAIER, *Assistant Examiner.*

U.S. Cl. X.R.

340—379